United States Patent
Kim et al.

(10) Patent No.: US 9,093,615 B2
(45) Date of Patent: Jul. 28, 2015

(54) LED MODULE, METHOD FOR MANUFACTURING THE SAME, AND LED CHANNEL LETTER INCLUDING THE SAME

(75) Inventors: Woo Seok Kim, Ansan-si (KR); Jae Young Choi, Ansan-si (KR); Kyu Won Han, Ansan-si (KR); Eun Jung Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 591 days.

(21) Appl. No.: 13/416,540

(22) Filed: Mar. 9, 2012

(65) Prior Publication Data
US 2012/0228649 A1  Sep. 13, 2012

(30) Foreign Application Priority Data

Mar. 11, 2011  (KR) .................. 10-2011-0022034
Mar. 11, 2011  (KR) .................. 10-2011-0022035

(51) Int. Cl.
| | | |
|---|---|---|
| H01L 33/54 | (2010.01) | |
| H01L 33/48 | (2010.01) | |
| F21K 99/00 | (2010.01) | |
| G09F 9/33 | (2006.01) | |
| H01L 33/62 | (2010.01) | |
| F21Y 101/02 | (2006.01) | |

(52) U.S. Cl.
CPC .............. *H01L 33/486* (2013.01); *F21K 9/00* (2013.01); *G09F 9/33* (2013.01); *F21K 9/90* (2013.01); *F21Y 2101/02* (2013.01); *H01L 33/62* (2013.01); *H01L 2924/0002* (2013.01)

(58) Field of Classification Search
CPC ........ H01L 33/52; H01L 33/62; H01L 33/486
USPC ............ 257/79, 99, 91, 92, 93, 100, E33.059
See application file for complete search history.

(56) References Cited

U.S. PATENT DOCUMENTS

| | | | |
|---|---|---|---|
| 2008/0283861 A1* | 11/2008 | Loh et al. | .......................... 257/98 |
| 2011/0007509 A1 | 1/2011 | Hayes et al. | |
| 2011/0316022 A1 | 12/2011 | Hussell | |

FOREIGN PATENT DOCUMENTS

| | | |
|---|---|---|
| JP | 2008-524826 | 7/2008 |
| JP | 2010-050323 | 3/2010 |
| JP | 2011-049253 | 10/2011 |
| WO | 2006/068762 | 6/2006 |

OTHER PUBLICATIONS

Non-Final Office Action dated Apr. 3, 2015, issued in U.S. Appl. No. 14/503,931.

* cited by examiner

*Primary Examiner* — Minchul Yang
(74) *Attorney, Agent, or Firm* — H.C. Park & Associates, PLC

(57) ABSTRACT

Disclosed herein is a method for manufacturing a light emitting diode (LED) module, the method including: disposing a circuit board at a molding space formed by an upper mold and a lower mold; adding a filling material to the molding space; hardening the filling material to form a molding cover covering at least a portion of an upper surface, a lower surface, and a side surface of the circuit board, the molding cover having an opening exposing the lower surface of the circuit board; removing the upper mold and the lower mold from the circuit board; and disposing an LED on the upper surface of the circuit board.

15 Claims, 15 Drawing Sheets

(a)

(b)

LED MODULE, METHOD FOR MANUFACTURING THE SAME, AND LED CHANNEL LETTER INCLUDING THE SAME

CROSS-REFERENCE TO RELATED APPLICATIONS

This application claims priority from and the benefit of Korean Patent Application No. 10-2011-0022034, filed on Mar. 11, 2011 and Korean Patent Application No. 10-2011-0022035, filed on Mar. 11, 2011, which are incorporated herein by reference for all purposes as if fully set forth herein.

BACKGROUND OF THE INVENTION

1. Field of the Invention

Exemplary embodiments of the present invention relate to a light emitting diode (LED) module, a method for manufacturing the same, and an LED channel letter including the same.

2. Discussion of the Background

A cold cathode fluorescent lamp (CCFL), which is called a 'fluorescent lamp,' has been widely used as an illumination device for a long period of time. However, the cold cathode fluorescent lamp has disadvantages such as a short lifespan, poor durability, a limited range of color selection, and low energy efficiency.

A light emitting diode (LED) has several advantages such as excellent responsibility, high energy efficiency, a long lifespan, and the like. In accordance with development of a high brightness and high output LED, the demand of the LED has rapidly increased as a light source for illumination or other light sources.

According to the related art, an LED module in which the LED is mounted on a circuit board such as a printed circuit board (PCB) has been known. A package level of LED, that is, an LED package has been typically mounted on the circuit board. However, recently, an interest in a chip level of LED, that is, an LED module in which one or more LED chips are mounted on a circuit board has increased. In the LED module as described above, the circuit board and the LED mounted on the circuit board are significantly vulnerable to an external environment such as humidity, air, and the like. Therefore, a technology of protecting electrodes and LEDs on a circuit board from an external environment has been demanded.

A technology of covering a circuit board with a molding cover manufactured by injection-molding a plastic resin in a molding space of a mold may be considered. Here, if a space is not present between a bottom of the molding and the circuit board, the molding cover is formed only on an upper surface of the circuit board. Therefore, even though the molding cover is provided, the entire bottom surface and the entire side of the circuit board are exposed to the external environment.

As an alternative to the above-mentioned technology, a technology of forming pin holes in a circuit board and inserting pins installed on a mold into the pin holes to position the circuit board at the center within a molding space of the mold may be considered. In this case, a molding cover formed in the molding space covers a bottom surface of the circuit board as well as an upper surface thereof. In this case, holes remaining after the pins are separated, that is, pin marks pass through the molding cover and are then connected to the pin holes of the circuit board, and a route from the pin marks to the pin holes becomes a route through which external humidity and/or air penetrates.

SUMMARY OF THE INVENTION

Therefore, exemplary embodiments of the present invention suggest a technology of providing an LED module having a structure in which pin holes formed in a circuit board are closed.

Recently, an illumination device formed by installing a plurality of LED modules in channels having a shape such as a letter, a logo, a symbol, a number, or a sign has been developed. This illumination device is called an 'LED channel letter'.

In an existing LED channel letter, as a connection scheme of a power supply or a circuit, a wire soldering scheme is mainly used. This scheme requires a manual operation to cause a process defect. In addition, when a problem occurs in only one LED module among several LED modules installed in a channel, the entire product should be replaced.

According to the present invention, when an LED module having a connector for connecting a power supply or a circuit is applied to an LED channel letter, in case a problem occurs in a specific LED module, a channel letter may be used by replacing only a corresponding LED module, which is economically practical. In addition, the LED channel letter requires a complicated shape in implementing a letter, a logo, a symbol, a number, and/or a sign. However, an LED module only including only a uni-direction connector or bi-directional connectors facing each other may not easily satisfy the above-mentioned requirement.

As an LED module for an LED channel letter, a structure in which a package level or chip level of LED is mounted on a circuit board such as a PCB is useful. In applying the LED module having the above-mentioned structure to the LED channel letter, one should consider both the performance of protecting the LED from external environment such as humidity, or the like, and heat radiation performance of appropriately radiating heat generated from the LED.

Another object of the present invention is to provide an LED channel having an improved structure and an LED module appropriate for the LED channel.

Another object of the present invention is to provide an LED channel letter in which an improved heat radiation route is provided between an LED in an LED module and a channel having the LED module installed therein and a route though which humidity, or the like, penetrates from the outside toward the LED in the LED module or a circuit board is reduced or block.

According to an exemplary embodiment of the present invention, there is provided a method for manufacturing an LED module, the method including: disposing a circuit board at a molding space formed by an upper mold and a lower mold; adding a filling material to the molding space; hardening the filling material to form a molding cover covering at least a portion of an upper surface, a lower surface, and a side surface of the circuit board, the molding cover having an opening exposing the lower surface of the circuit board; removing the upper mold and the lower mold from the circuit board; and disposing an LED on the upper surface of the circuit board.

According to another exemplary embodiment of the present invention, there is provided a light emitting diode (LED) module, including: a circuit board; an LED disposed on the circuit board; and a molding cover covering at least a portion of an upper surface, a lower surface, and a side surface of the circuit board. The molding cover has an opening at the lower surface of the circuit board exposing the lower surface of the circuit board.

According to still another exemplary embodiment of the present invention, there is provided a light emitting diode (LED) channel letter, including: a channel having two sidewalls and a bottom positioned between the two sidewalls; and a plurality of LED modules disposed on an upper surface of the bottom of the channel. Each of the plurality of LED modules comprises an LED, a circuit board having the LED disposed thereon, and a molding cover covering at least a portion of an upper surface, a lower surface, and a side surface of the circuit board, the molding cover having an opening at the lower surface of the circuit board exposing the lower surface of the circuit board. The channel has a protrusion on the upper surface of the bottom thereof to be inserted into the opening to contact the lower surface of the circuit board.

According to still another exemplary embodiment of the present invention, there is provided a light emitting diode (LED) module, including: a circuit board comprising at least two holes; an LED disposed on the circuit board; and a molding cover covering at least a portion of an upper surface, a lower surface, and a side surface of the circuit board. The molding cover extends into each of the at least two holes without completely filling each of the at least two holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
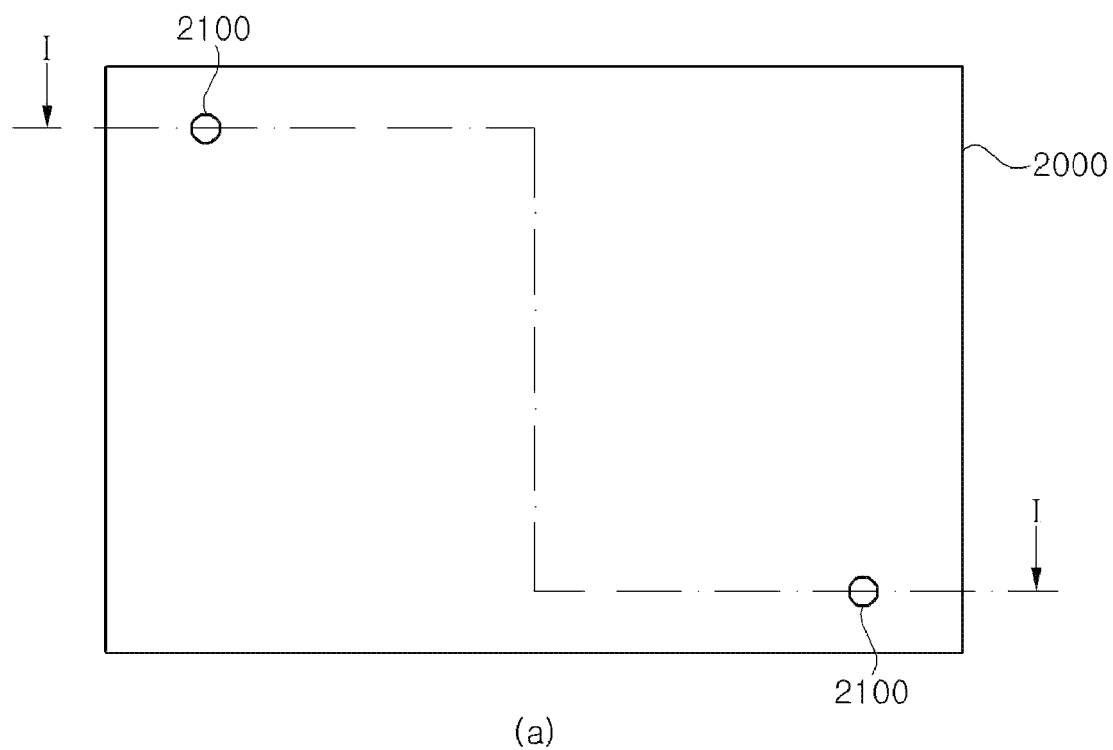
FIGS. 1 to 4 are views that illustrate a process of preparing a circuit board and molding a molding cover on the circuit board in a method for manufacturing an LED module according to an exemplary embodiment of the present invention.
Figure 1:
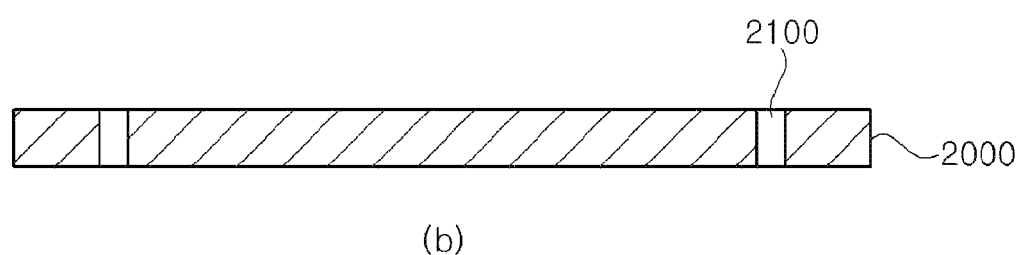

Hereinafter, exemplary embodiments of the present invention will be described in detail with reference to the accompanying drawings. The exemplary embodiments of the present invention to be described below are provided by way of example so that the idea of the present s invention can be sufficiently transferred to those skilled in the art to which the present invention pertains. Therefore, the present invention is not limited to the exemplary embodiments set forth herein but may be modified in many different forms.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that when an element such as a layer, film, region, or substrate is referred to as being "beneath" another element, it can be directly beneath the other element or intervening elements may also be present. Meanwhile, when an element is referred to as being "directly beneath" another element, there are no intervening elements present.

Hereinafter, exemplary embodiments of the present invention will be explained in detail with reference to the accompanying drawings.

Figure 3:
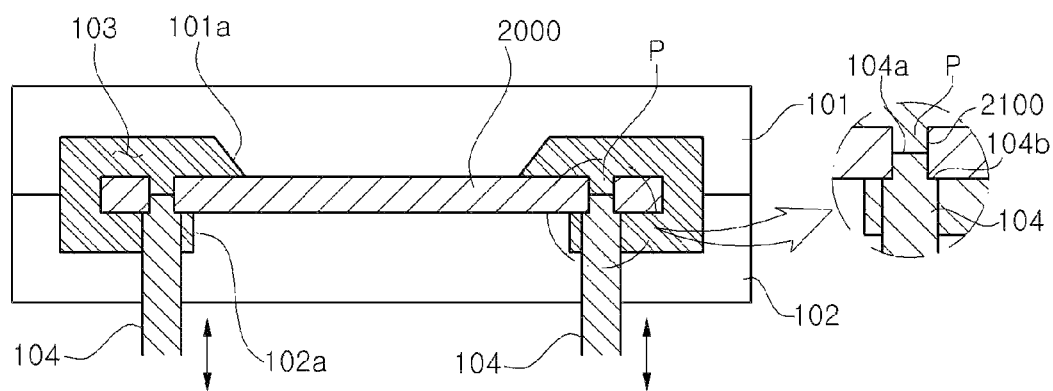
Figure 4:
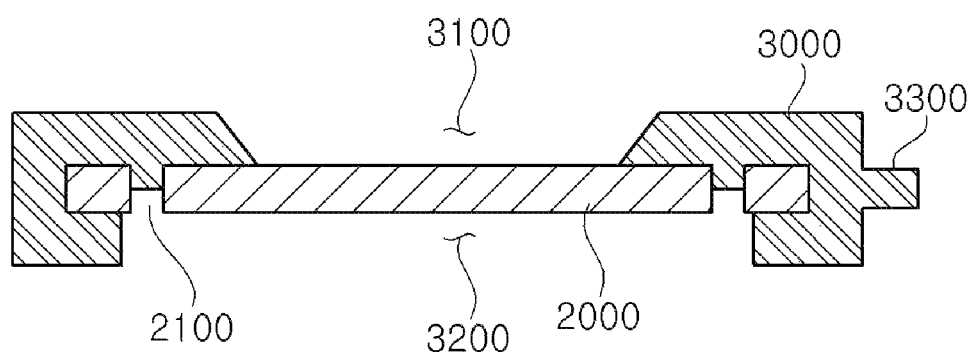
Figure 5:
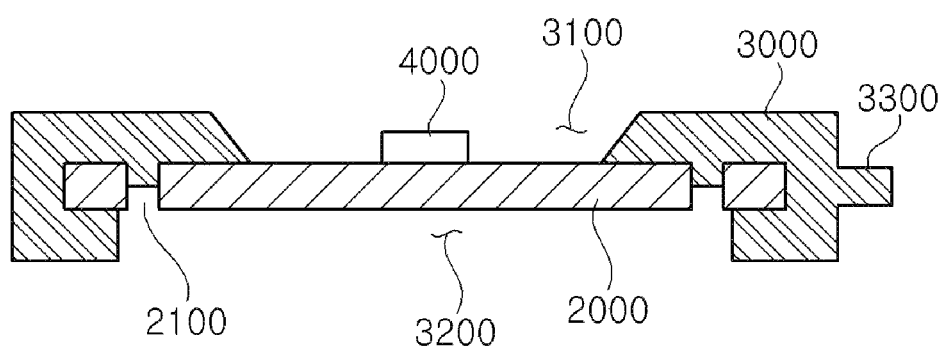
FIG. 5 is a view that illustrates an LED which is mounted on the circuit board s having the molding cover formed thereon in the method for manufacturing an LED module according to the exemplary embodiment of the present invention.
Figure 6:
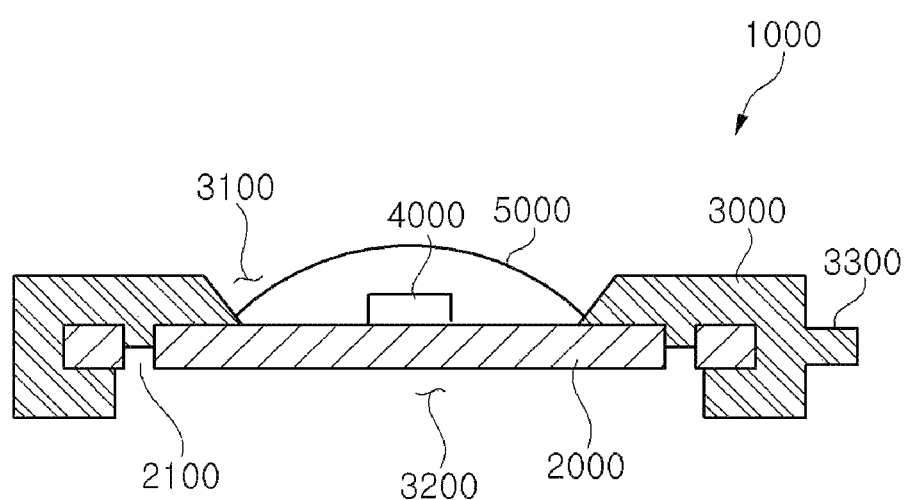
FIG. 6 is a view describing an LED module after the LED is sealed by a sealant in the method for manufacturing an LED module according to the exemplary embodiment of the present invention.
Figure 7:
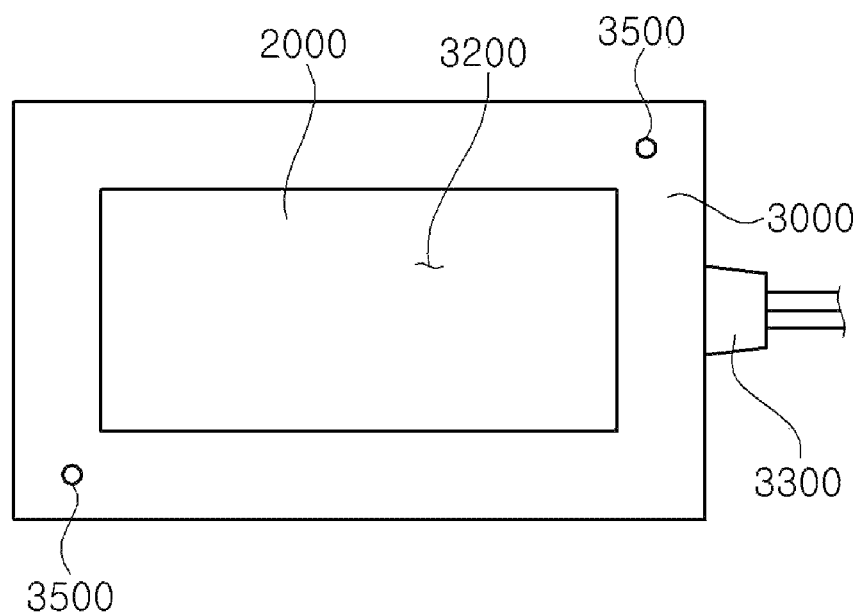
FIG. 7 is a bottom view that illustrates a lower surface of the LED module shown in FIG. 6.

FIGS. 1 to 5 are views that illustrate a method for manufacturing an LED module according to an exemplary embodiment of the present invention, wherein FIGS. 1 to 4 illustrate a process of preparing a circuit board and covering a molding cover on the circuit board, and FIG. 5 illustrates an LED which is mounted on the circuit board having the molding cover formed thereon. FIG. 6 illustrates an LED module completely manufactured through a process of finally sealing the LED with a sealant. FIG. 7 is bottom view that illustrates a lower surface of the LED module shown in FIG. 6.

In order to manufacture an LED module according to an exemplary embodiment of the present invention, a circuit board 2000 is first prepared as shown in FIGS. 1A and 1B. FIGS. 1A and 1B are, respectively, a plan view of a prepared circuit board 2000 and a cross-sectional view of the circuit board 2000 taken along the line I-I of FIG. 1A.

As shown in FIG. 1, two vertical penetrating pin holes 2100 may be formed through the circuit board 2000. The pin holes 2100 serve to stably maintain the circuit board 2000 within a mold when they are inserted into pins installed on the mold as described in detail below. In the present embodiment, the two pin holes 2100 are formed to face each other in a diagonal direction. The diagonal disposition of the pin holes 2100 and the pins inserted into the pin holes 2100 allows the circuit board 2000 to be stably supported even with a small number of pin holes and/or pins. The present invention is not limited to the specific number of pin holes. According to the present embodiment, the circuit board 2000 is a printed circuit board (PCB) to mount a light emitting diode (LED) thereon. Although not shown, the circuit board 2000 may include circuit patterns formed thereon, wherein the circuit patterns include electrode patterns. The circuit board 2000 may be a metal PCB (MPCB) or a metal core PCB (MCPCB) based on a metal having excellent thermal conductivity.

Figure 2:
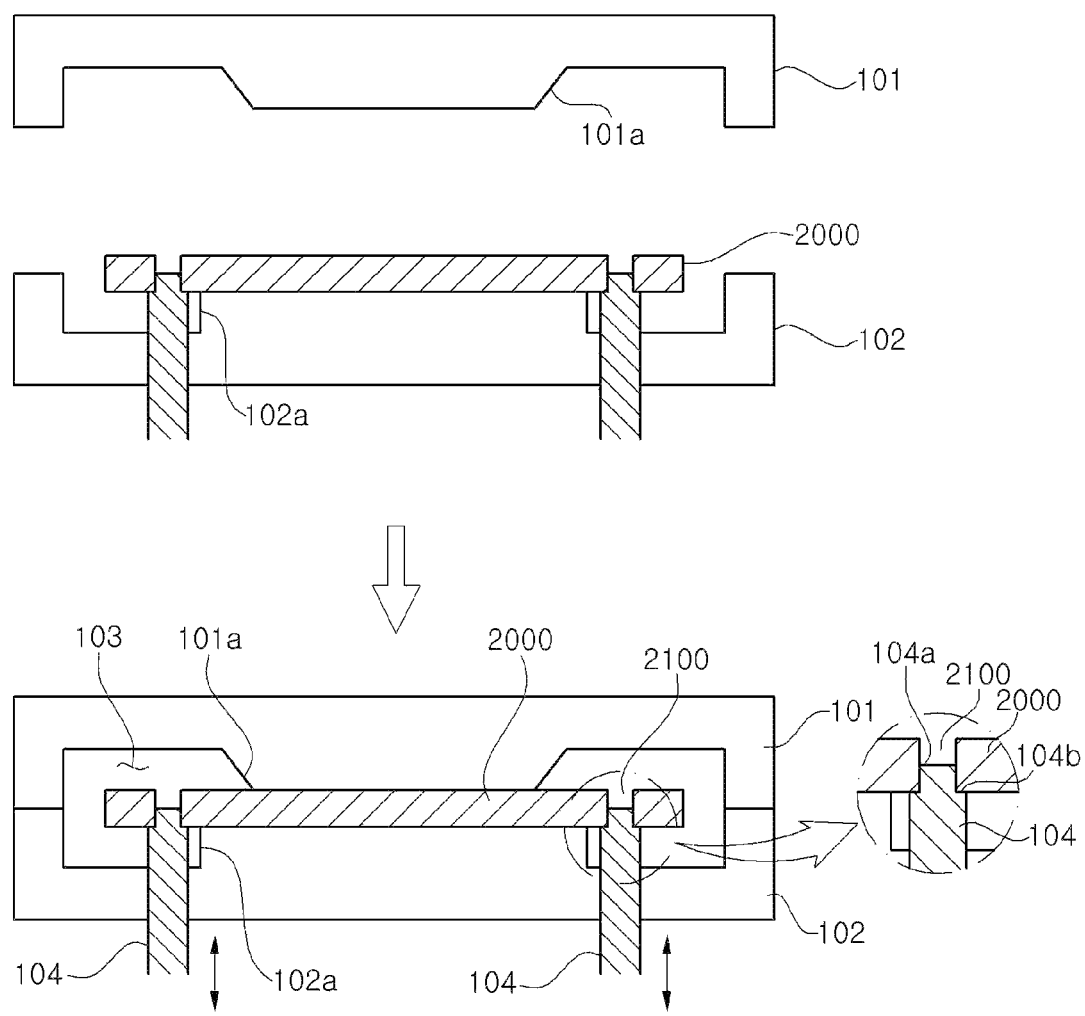

As shown in FIG. 2, the circuit board 2000 is disposed at a molding space 103 of a mold that includes an upper mold 101 and a lower mold 102. Two pins 104 are installed at a lower portion of the mold, that is, on the lower mold 102.

Each of the pins 104 may be variable type pins that may be advanced and retracted vertically in the molding space 103. A pressing scheme and a screw conveying scheme are exemplary schemes of driving the variable type pin. It is noted that although the variable type pins are used in the present embodiment, fixed type pins which are fixedly installed on the mold may also be used.

Each of the pins 104 has a tip portion 104a, and a support end portion 104b positioned under the tip portion 104a and having a cross-sectional area wider than that of the tip portion 104a. The pins 104 are inserted into the pin holes 2100 formed in the circuit board 2000 to stably support the circuit board 2000 horizontally in the center within the molding space 103. Here, the tip portion 104a is not limited to a certain height. Rather, the tip portion 104a just needs to be high enough to be inserted into the pin hole 2100 in such a manner that it stably holds the circuit board but not so high that it is flush with the upper surface of the circuit board 2000. In this way, the molding cover 3000, which will be described afterwards, can extend to a point just below the upper surface of the circuit board 2000 to a point just above the lower surface of the circuit board 2000.

In addition, the lower mold 102 has a protrusion 102a shape configured to be in contact with a lower surface of the circuit board 2000 and having a substantially rectangular cross section. In addition, the upper mold 101 has a substantially truncated conical protrusion 101a shape configured to be in contact with a central area of an upper surface of the circuit board 2000, on which an LED is to be mounted.

The protrusion 102a formed at a lower portion of the molding space 103 is provided so that a molding cover partially exposes the lower surface of the circuit board 2000 for heat radiation. Here, the protrusion 102a formed at the lower portion of the molding space 103 also serves to help the pins 104 to support the circuit board 2000. If the molding cover is formed over the entire surface of the circuit board 2000, the protrusion 102a formed at the lower portion of the molding space 103 may be omitted. In addition, the protrusion 101a formed at an upper portion of the molding space 103 is provided to form a cavity through which the LED may be mounted on the circuit board 2000 in a subsequent process. The truncated conical shape of the s protrusion 101a allows an inner wall surface of the cavity to be an inclined reflective surface.

The tip portions 104a of the pins 104 are inserted into the pin holes 2100 of the circuit board 2000, and the support end portions 104b thereof are configured to be in contact with the lower surface of the circuit board 2000. Here, the tip portion 104a is inserted in only a portion of a lower portion of the pin hole 2100, and a remaining space of an upper portion of the pin hole 2100 is to be filled with a plastic resin which forms a molding cover when the molding cover is formed.

As shown in FIG. 3, the molding space 103 is filled with a filling material such as a liquid or gel plastic resin P. The filling material is then hardened in the molding space 103 to constitute the molding cover which partially covers the upper surface and the lower surface, and sides of the circuit board 2000. The plastic resin P to form the molding cover is filled in an upper space of the pin hole 2100 to close the pin hole 2100. For discrimination, "P" is used as a reference symbol that indicates the plastic resin, and "3000" is used as a reference numeral that indicates the molding cover formed of the plastic resin.

Thereafter, the upper mold 101 and the lower mold 102 are removed from the circuit board 2000. When the molding as shown in FIGS. 2 and 3, more specifically, insert injection molding is completed, the molding cover 3000 as shown in FIG. 4 is formed. This molding cover 3000 partially covers the upper surface and the lower surface, and the sides of the circuit board 2000. The molding cover 3000 may include a cavity 3100 formed on an upper surface thereof that conforms to the shape of the upper portion of the molding space described above, and a heat radiation hole 3200 formed on a lower surface thereof that conforms to the shape of the lower portion of the molding space described above. In addition, the molding cover 3000 may include a connector housing portion 3300 formed at a side thereof.

The cavity 3100 is formed on the upper surface of the circuit board 2000, that is, at an area at which the LED is to be mounted, and has an inclined reflective surface. In addition, the heat radiation hole 3200 exposes the circuit board 2000. In addition, the pin hole 2100 formed in the circuit board 2000 is closed by a portion of the molding cover 3000.

Referring to FIG. 5, an LED 4000 is mounted in the cavity 3100. The LED 4000 may be a package level of LED, that is, an LED package, or a chip level of LED, that is, an LED chip. Referring to FIG. 6, a light-transmitting sealant 5000 to protect the LED 4000 may be formed with a substantially lens shape. According to the present embodiment, the sealant 5000 has a substantially hemispherical shape in which a widest portion of a lower portion thereof covers edges of a lower surface of the cavity 3100. Through the above-mentioned process, manufacturing of the LED module 1000 as shown in FIG. 6 is completed.

Referring to FIG. 7, in the LED module, the heat radiation hole 3200 is formed to have a substantially rectangular shape at the lower surface of the molding cover 3000, and the lower surface of the circuit board 2000 is exposed to the heat radiation hole 3200. Two pin marks 3500 are formed to face each other diagonally with the heat radiation hole 3200 interposed therebetween. These two pin marks 3500, which are pin marks remaining after the pins that were used at the time of molding are separated, are formed to match the pin holes 2100 (See FIG. 6) formed in the circuit board 2000.

Figure 8:
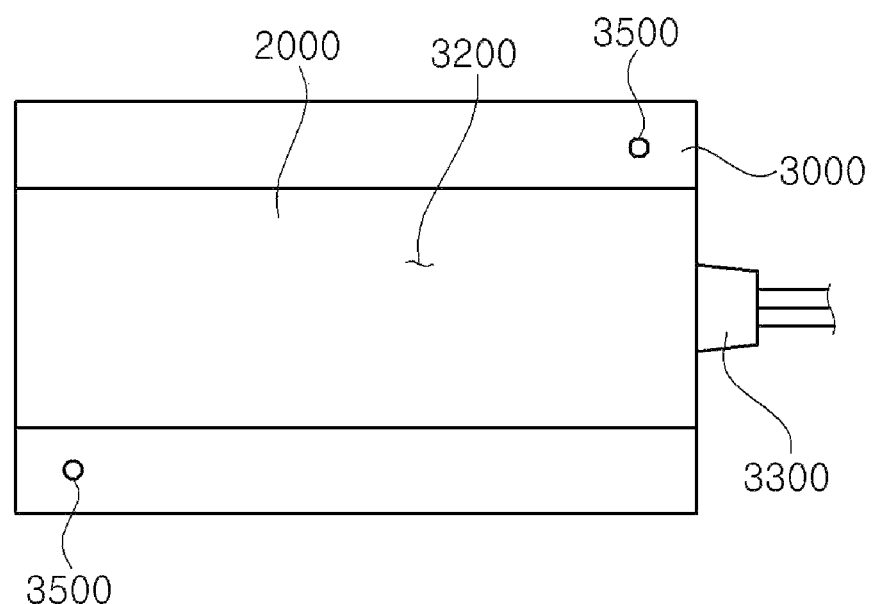
FIG. 8 is a bottom view that illustrates an LED module according to another exemplary embodiment of the present invention.

FIG. 8 is a bottom view that illustrates an LED module according to another exemplary embodiment of the present invention. Referring to FIG. 8, the LED module has a channel shape in which two opposite sides of the heat radiation hole 3200 formed at a lower surface of the molding cover 3000 are opened and connected to their respective positions at which they are in contact with the two sides of the molding cover 3000.

FIGS. 9A to 9D are views that illustrate a method for manufacturing an LED module according to another exemplary embodiment of the present invention.

Figure 9A:
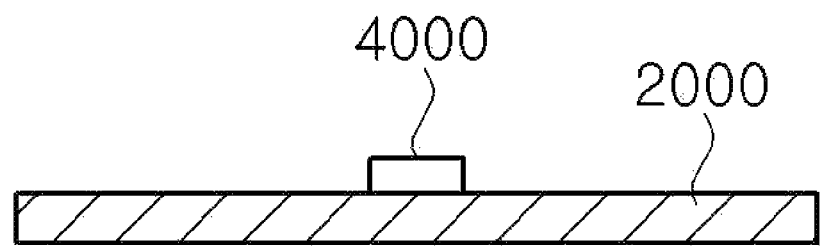
FIGS. 9A to 9D are views that illustrate a method for manufacturing an LED module according to another exemplary embodiment of the present invention.
Figure 9B:
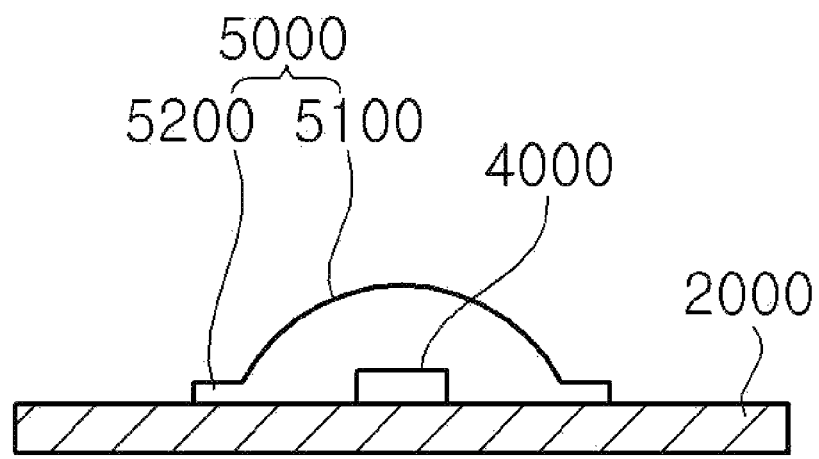
Figure 9C:
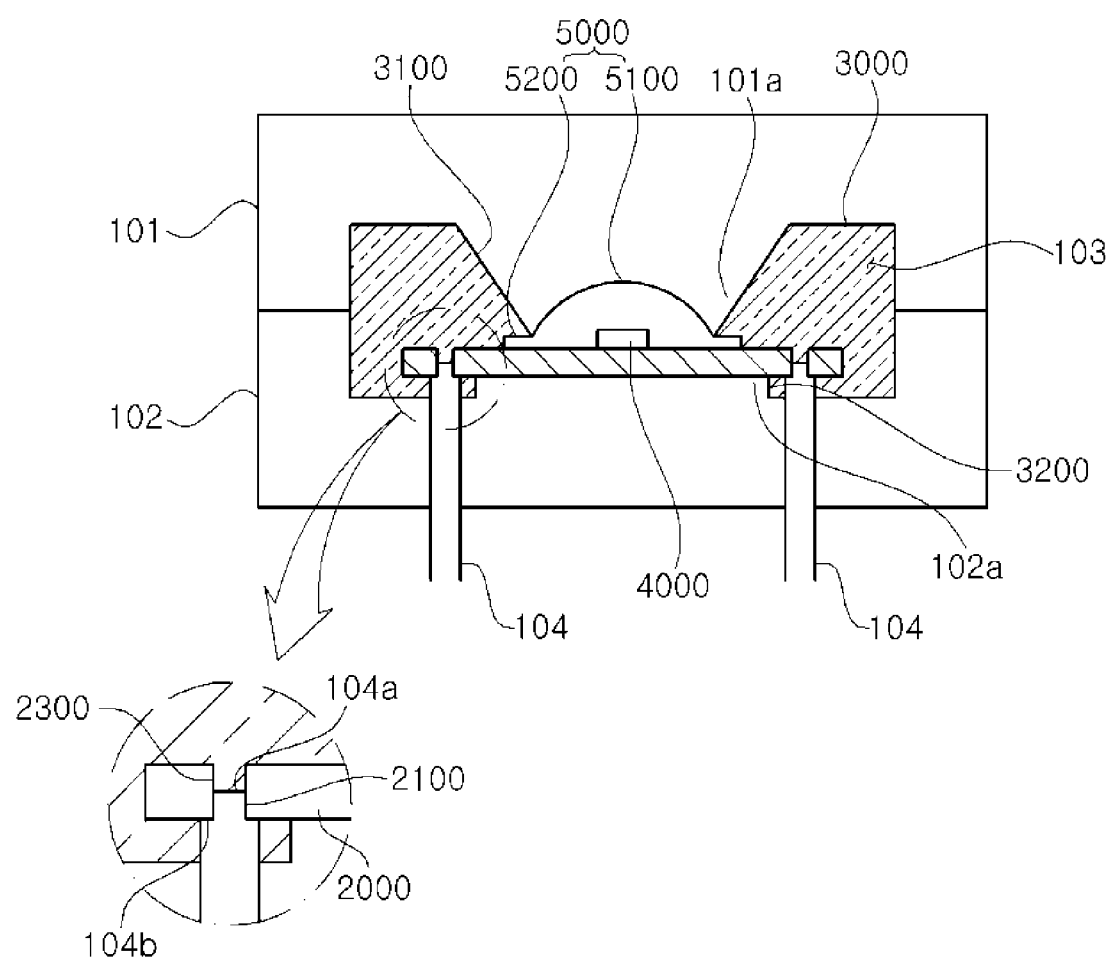

First, as shown in FIG. 9A, a package level or chip level of LED 4000 is mounted on an upper surface of a circuit board 2000. Then, as shown in FIG. 9B, a light-transmitting sealant 5000 having a hemispherical lens portion 5100 and a ring shaped edge portion 5200 in the vicinity of the hemispherical lens portion 5100 is formed to cover the LED 4000. Thereafter, as shown in FIG. 9C, a molding cover 3000 to partially cover an upper surface and a lower surface, and sides of the circuit board 2000 is formed by, for example, insert injection molding, except for a cavity 3100 to expose the light-transmitting sealant 5000 and a heat radiation hole 3200 to partly expose an area of a lower surface of the circuit board 2000. Since a lower portion of the cavity of the molding cover 3000 has a size smaller than that of the ring shaped edge portion 5200, the molding cover 3000 is surface-bonded to an upper surface of the edge portion 5200. The molding cover 3000 and the sealant 5000 may be formed of the same material having a difference only in terms of transparency or plastic resin materials having a similar physical property to improve adhesion between the molding cover 3000 and the sealant 5000.

According to the present embodiment, the molding cover 3000 is molded in a molding space 103 defined by an upper mold 101 and a lower mold 102, and pins 104 are used in order to stably maintain the circuit board 2000 at the center of the molding space 103. Each of the pins 104 has a tip portion 104a and a support end portion 104b, wherein the tip portion 104a is inserted into a portion of a lower portion of the pin hole 2100 formed in the circuit board 2000 and the support end portion 104b is in contact with the circuit board 2000 to support the circuit board 2000. A shape of the cavity 3100 and a shape of the heat radiation hole 3200 are determined by shapes of the upper and lower portions 101a and 102a of the molding space 103.

Figure 9D:
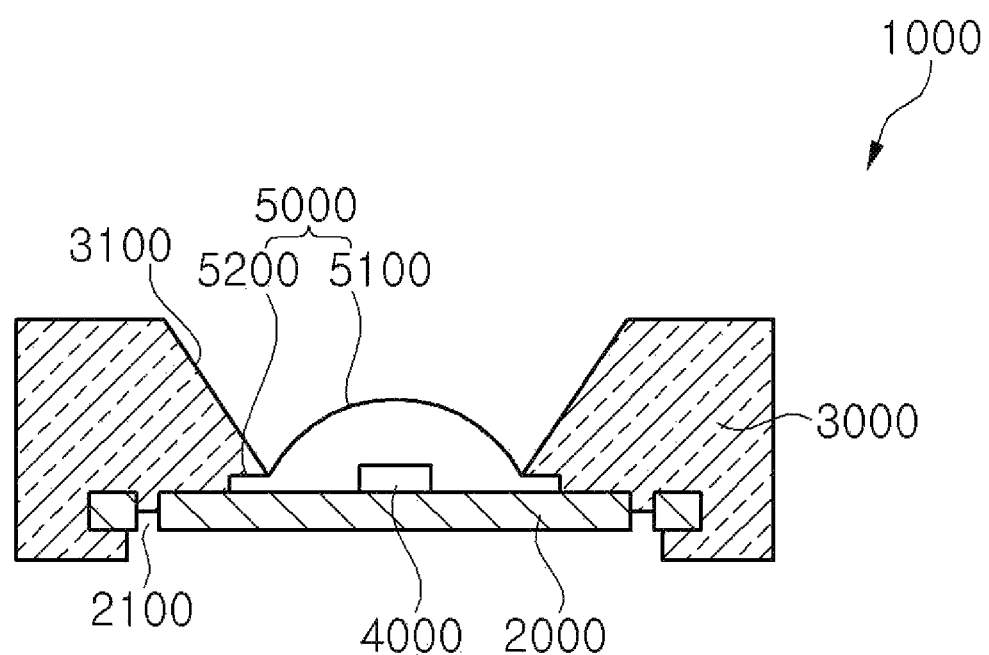

An LED module 1000 separated from the mold is shown in FIG. 9D. Describing the LED module 1000 once again with reference to FIG. 9D, the LED 4000 is mounted in an LED mounting area on the upper surface of the circuit board 2000, and the sealant 5000 to cover the LED 4000 is formed at substantially the center of the upper surface of the circuit board 2000. The molding cover 3000 partially covers the upper surface and the lower surface, and sides of the circuit board 2000. The molding cover 3000 may include the cavity 3100 to correspond to the LED mounting area to thereby expose the LED 4000 and the sealant 5000, and the heat radiation hole 3200 partly exposes an area of the center of the lower surface of the circuit board 2000. In the present embodiment, the sealant 5000 has a central lens portion 5100 and an edge portion 5200 in the vicinity of the central lens portion 5100, and the molding cover 3000 is formed after the sealant 5000 is formed, such that a portion of a lower surface of the molding cover 3000 is bonded to an upper surface of the edge portion 5200. A portion of the lower surface of the molding cover 3000 surface-contacts a portion of the sealant 5000, that is, the upper surface of the edge portion 5200, such that a reliable interface is secured between the sealant 5000 and the molding cover 3000. This interface reduces the likelihood of infiltration of humidity or moisture into the LED 4000 or the surrounding area of the LED 4000 through a gap between the sealant 5000 and the molding cover 3000.

An upper portion of the pin hole 2100 is also closed by a portion of the molding cover 3000.

Figure 10:
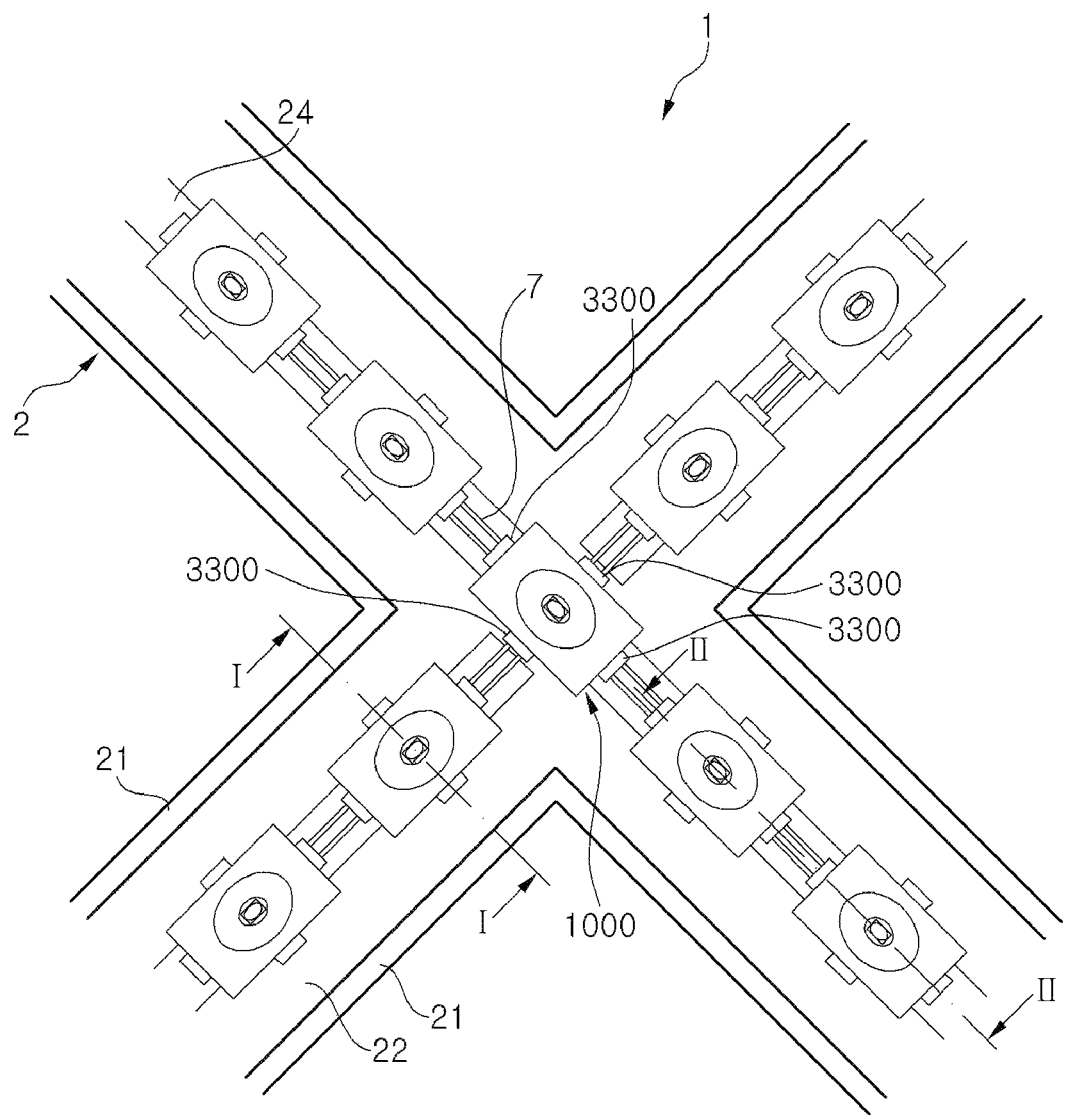
FIG. 10 is a plan view that partially illustrates an LED channel letter according to the exemplary embodiment of the present invention.
Figure 11:
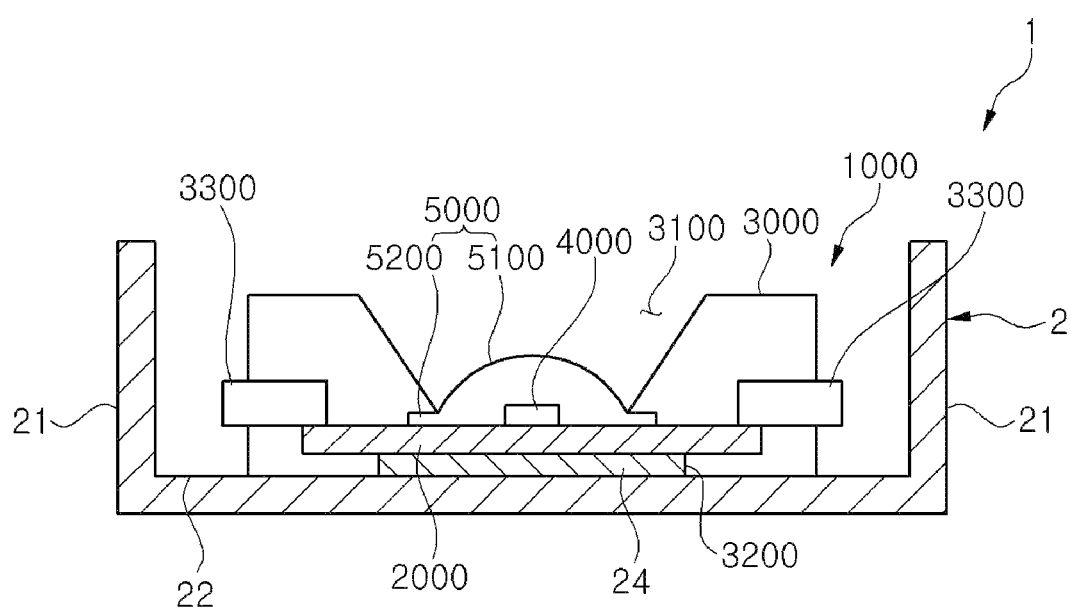
FIG. 11 is a cross-sectional view taken along the line I-I of FIG. 10.
Figure 12:
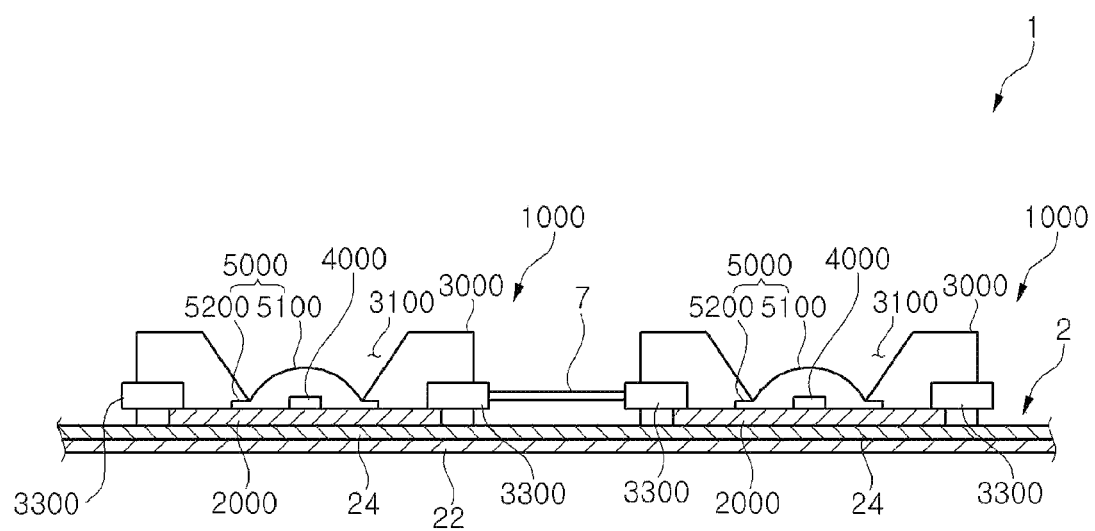
FIG. 12 is a cross-sectional view taken along the line II-II of FIG. 10.
Figure 13:
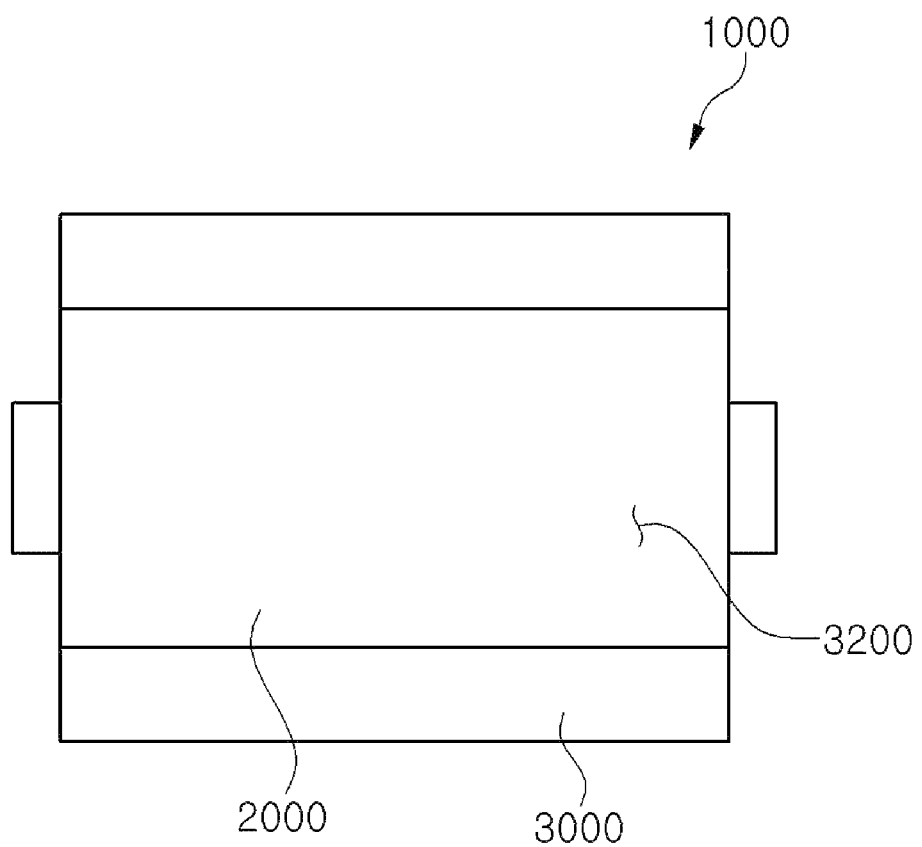
FIG. 13 is a bottom view of an LED module shown in FIGS. 10 to 12.

FIG. 10 is a plan view that partially illustrates an LED channel letter according to the exemplary embodiment of the present invention; FIG. 11 is a cross-sectional view taken along the line I-I of FIG. 10; FIG. 12 is a cross-sectional view taken along the line II-II of FIG. 10; and FIG. 13 is a bottom view of an LED module shown in FIGS. 10 to 12.

As shown in FIGS. 10 to 12, an LED channel letter 1 according to the exemplary embodiment of the present invention may include an upper open type channel 2 having a substantially "X" shaped plane and a plurality of LED modules 1000 disposed in the channel 2. Although not shown, a light diffusion member including a light-transmitting plastic plate or a light-transmitting glass to cover an upper portion of the channel 2 and/or a light-transmitting resin filled in an inner portion of the channel 2 may be provided.

The present embodiment is not limited to a plane shape of the channel letter 1 shown in FIG. 10. That is, the channel letter 1 may have various shapes according to a letter, a logo, a symbol, a number, and/or a sign that is to be implemented.

According to the present embodiment, the channel 2 may include a pair of sidewalls 21 and 21 facing each other and a bottom 22 positioned between the sidewalls. In addition, a band shaped protrusion 24 may be disposed on an upper surface of the bottom 22 of the channel 2 in a direction that is in parallel with the sidewalls 21 and 21. The protrusion 24 may be formed by attaching a band shaped member having a certain length and thickness to the upper surface of the bottom 22 of the channel 2. Alternatively, the protrusion 24 may be formed integrally with the bottom of the channel 2 by press processing during a process of manufacturing the channel 2 or a process before or after the process of manufacturing the channel 2. The protrusion 24, which is provided at a heat radiation path between the LED module 1000 and the channel 2, may have high thermal conductivity, as described in detail below.

As shown in FIGS. 11 and 12, the LED module 1000 may include a circuit board 2000, an LED 4000 mounted on the circuit board 2000, and a molding cover 3000 disposed to partially cover an upper surface and a lower surface, and sides of the circuit board 2000. Here, the molding cover 3000 may include a cavity 3100 formed at a partial area of an upper surface thereof to expose the LED 4000, and a heat radiation hole 3200 formed at a partial area of a lower surface thereof to expose a lower surface of the circuit board 2000.

Further, the LED module 1000 may include a light-transmitting sealant 5000 molded inside the cavity 3100 so as to protect the LED 4000. This sealant 5000 may be formed on the upper surface of the circuit board 2000 so as to cover the LED 4000 before the molding cover 3000 is formed.

The sealant 5000 has a substantially hemispherical central lens portion 5100 and a ring shape edge portion 5200 in the vicinity of the lens portion 5100. The sealant 5000 is formed to correspond to a position of the cavity 3100 of the molding cover 3000 before the molding cover 3000 is formed. The ring shape edge portion 5200 may be formed to have a width wider than that of a lower portion of the cavity 3100 having an inclined structure. When the molding cover 3000 is formed, the molding cover 3000 is partially surface-bonded to an upper surface of the ring shaped edge portion 5200.

Therefore, the molding cover 3000 and the sealant 5000 cover almost the entire circuit board 2000 except for the heat radiation hole 3200 in a partial area of a lower surface of the molding cover 3000, which significantly reduces external humidity infiltrating into the surrounding area of the LED 4000 through the circuit board 2000.

Meanwhile, the molding cover 3000 and the sealant 5000 may be formed of the same or similar plastic material to improve adhesion between the molding cover 3000 and the sealant 5000. According to the present embodiment, the molding cover 3000 and the sealant 5000 may be formed of the same plastic material, wherein dye or pigment such as a white color, a silver-white color, a silver color, or the like, to improve reflectivity is added to the plastic resin that forms the molding cover 3000.

Meanwhile, when the plurality of LED module 1000 are mounted on the upper surface of the bottom 22 of the channel 2, the band shaped protrusion 24 fixedly disposed on the upper surface of the bottom 22 is inserted into the heat radiation hole 3200 formed at the lower surface of the molding cover 3000. At this time, the protrusion 24 contacts the circuit board 2000 exposed by the heat radiation hole 3200.

As shown in FIG. 13, the heat radiation hole 3200 may extend from an edge of the lower surface of the molding cover 3000 to an opposite edge so as to correspond to the shape of the protrusion 24. Therefore, the heat radiation hole 3200 has a channel shape in which both sides thereof are opened laterally at the lower surface of the molding cover 3000. In addition, the entire upper surface of the protrusion 24 may be a plane so as to increase a contact area with a flat lower surface of the circuit board 2000. Through the structure in which the both sides of the heat radiation hole 3200 are opened, several heat radiation holes included in several LED modules may be inserted to an elongate protrusion 24.

The configuration of the channel letter 1 described above forms a heat radiation route from the LED 4000 in the LED module 1000 to the outside through the circuit board 2000 and the protrusion 24 and the channel 2 that contact the circuit board 2000, as shown in FIGS. 11 and 12. Through this heat radiation route, heat generated from the LED 4000 may be efficiently radiated to the outside of the channel letter 1.

Referring to FIG. 10, the LED module 1000 has a substantially rectangular shape and includes four connectors 3300 installed on each of four sides. Each of the connectors 3300 are installed on each of the sides of the LED module 1000, particularly, the molding cover 3000, thereby making it possible to easily implement a complicated channel letter such an "X" shape shown in FIG. 10 and to simplify an operation of disposing the LED modules in the channel having the complicated shape and connecting the LED modules to each other using wires 7.

According to the present embodiment, vertically intersecting four linear unit channels are collected to configure an "X" shaped channel 2. The LED module 1000 installed in an intersecting area of the four unit channels, that is, a central area of the channel 2 utilizes all of the four connectors 3300, and remaining LED modules 1000 utilize only two connectors or one connector 3300.

The LED module 1000 according to the present embodiment may have a rectangular shape with four sides and a total of four connectors provided on each of the four sides. However, the LED module 1000 may have three, four, five, six, or more connectors according to whether it has a triangular shape, a rectangular shape, a pentagonal shape, a hexagonal shape, or other polygonal shapes.

The LED module 1000 used in the LED channel 2 may be manufactured by the method for manufacturing an LED module described with reference to FIGS. 1 to 6 or the method for manufacturing an LED module described with reference to FIGS. 9A to 9D.

Figure 14:
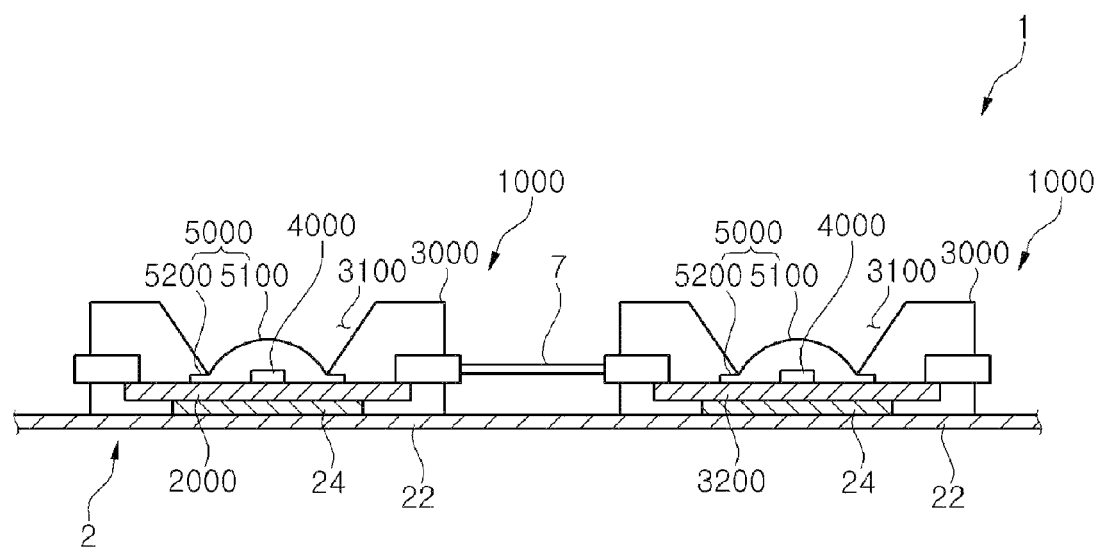
FIG. 14 is a cross-sectional view of a channel letter describing another exemplary embodiment of the present invention.

FIG. 14 is a cross-sectional view of a channel letter describing another exemplary embodiment of the present invention.

Referring to FIG. 14, a channel letter 1 may include a plurality of protrusions 24 formed on an upper surface of a bottom 22 of a channel 2 and having a block shape, and an LED module 1000 may include a heat radiation hole 3200 formed to expose a lower surface of a circuit board 2000, similar to the above-mentioned embodiment. The heat radiation hole 3200 has a shape corresponding to that of the protrusion 24 of the channel letter 1 to be inserted into the protrusion 24. In addition, each of the protrusions 24 is inserted into the heat radiation hole 3200 to contact the lower surface of the circuit board 2000. According to the present embodiment, the LED channel letter 1 may include a plurality of LED modules 1000 disposed therein, wherein each of the plurality of LED modules 1000 is fixedly maintained on the upper surface of the bottom 22 of the channel 2 by inserting the heat radiation hole 3200 into the protrusion 24. In addition, the heat radiation hole 3200 and the protrusion 24 provide a heat radiation route from the inside of the LED module 1000 to the outside thereof.

According to the exemplary embodiments of the present invention, the molding cover formed by molding with a mold covers the upper surface, the lower surface, and the sides of the circuit board, thereby making it possible to better protect the electrode, the LED, and the like, on the circuit board from humidity and/or air of an external environment. In addition, the penetration pin hole of the circuit board that has been used together with the pin of the mold in order to maintain the circuit board at the center of the molding space is closed with a portion of the molding cover, thereby making it possible to prevent penetration of humidity or external air through the pin hole of the circuit board.

According to the exemplary embodiments of the present invention, when the LED module having the connector for connecting a power supply or a circuit is applied to the LED channel letter, in case a problem occurs in a specific LED module, the channel letter may be used by replacing only a corresponding LED module, which is economically practical. Further, the LED channel letter according to the exemplary embodiment of the present invention may implement a complicated letter, logo, symbol, number, and/or sign. Particularly, the LED module according to the exemplary embodiment of the present invention is excellent in view of performance of protecting the LED from the external environment such as humidity, or the like, and heat radiation performance of appropriately radiating heat generated from the LED, such that the LED module may be usefully used for the LED channel letter.

What is claimed is:

1. A light emitting diode (LED) module, comprising:
   a circuit board;
   an LED disposed on the circuit board; and
   a molding cover covering at least a portion of an upper surface, a lower surface, and a side surface of the circuit board,
   wherein the molding cover has an opening at the lower surface of the circuit board exposing the lower surface of the circuit board, and
   wherein the circuit board comprises a hole extending from the upper surface to the lower surface, and a portion of the molding fills a portion of the hole.

2. The LED module of claim 1, wherein the opening extends from a first edge of the circuit board to a second edge of the circuit board, the first and second edges being opposite edges of the circuit board.

3. The LED module of claim 1, wherein the molding cover has a polygonal plane shape having a plurality of sides and comprises a plurality of connectors.

4. The LED module of claim 3, wherein the connectors are provided on the sides of the molding cover.

5. The LED module of claim 1, further comprising a light-transmitting sealant covering the LED, wherein the molding cover has a cavity formed at an area at which the sealant is formed, the sealant has an edge portion, and the molding cover is disposed to be in contact with an upper portion of the edge portion.

6. The LED module of claim 1, further comprising a light-transmitting sealant covering the LED, wherein the sealant comprises a central lens portion and an edge portion in a vicinity of the lens portion, and the molding cover contacts an upper surface of the edge portion.

7. A light emitting diode (LED) channel letter, comprising:
   a channel having two sidewalls and a bottom positioned between the two sidewalls; and
   a plurality of LED modules disposed on an upper surface of the bottom of the channel,
   wherein each of the plurality of LED modules comprises an LED, a circuit board having the LED disposed thereon, and a molding cover covering at least a portion of an upper surface, a lower surface, and a side surface of the circuit board, the molding cover having an opening at the lower surface of the circuit board exposing the lower surface of the circuit board, and wherein the channel has a protrusion on the upper surface of the bottom thereof to be inserted into the opening to contact the lower surface of the circuit board.

8. The LED channel letter of claim 7, wherein the opening extends from a first edge of the circuit board to a second edge of the circuit board, the first and second edges being opposite edges of the circuit board, the protrusion has a band shape in parallel with sidewalls of the channel, and a plurality of openings of the LED modules are inserted into the protrusion.

9. The LED channel letter of claim 8, wherein the opening has a shape corresponding to that of a cross section of the protrusion, and each of the openings is inserted into the protrusion.

10. The LED channel letter of claim 7, wherein the molding cover has a polygonal plane shape having a plurality of sides and comprises a plurality of connectors.

11. The LED channel letter of claim 10, wherein the connectors are provided on the sides of the molding cover.

12. The LED channel letter of claim 11, wherein the plurality of LED modules comprise an LED module which utilizes all of the connectors installed on each of the sides and LED modules which utilize some of the connectors installed on each of the sides.

13. The LED channel letter of claim 7, wherein each of the LED modules further comprises a light-transmitting sealant on the upper surface of the circuit board covering the LED, and the molding cover has a cavity exposing the sealant.

14. The LED channel letter of claim 13, wherein the sealant has a central lens portion and an edge portion in a vicinity of the lens portion, and the molding cover contacts an upper surface of the edge portion.

15. A light emitting diode (LED) module, comprising:
a circuit board comprising at least two hole;
an LED disposed on the circuit board; and
a molding cover covering at least a portion of an upper surface, a lower surface, and a side surface of the circuit board,
wherein the molding cover extends into each of the at least two holes without completely filling each of the at least two holes.

* * * * *